US011683881B2

(12) United States Patent
Yu et al.

(10) Patent No.: US 11,683,881 B2
(45) Date of Patent: Jun. 20, 2023

(54) ORIGAMI-BASED STRETCHABLE ELECTRONIC DEVICE AND METHODS FOR THEIR MANUFACTURE

(71) Applicant: The Hong Kong University of Science and Technology, Hong Kong (CN)

(72) Inventors: Hongyu Yu, Hong Kong (CN); Yongkai Li, Hong Kong (CN)

(73) Assignee: THE HONG KONG UNIVERSITY OF SCIENCE AND TECHNOLOGY, Hong Kong (CN)

( * ) Notice: Subject to any disclaimer, the term of this patent is extended or adjusted under 35 U.S.C. 154(b) by 46 days.

(21) Appl. No.: 17/308,576

(22) Filed: May 5, 2021

(65) Prior Publication Data

US 2021/0352800 A1     Nov. 11, 2021

Related U.S. Application Data

(60) Provisional application No. 63/101,565, filed on May 5, 2020.

(51) Int. Cl.
| | |
|---|---|
| *H05K 1/18* | (2006.01) |
| *H05K 1/02* | (2006.01) |
| *H05K 3/28* | (2006.01) |
| *H05K 3/00* | (2006.01) |
| *H05K 1/03* | (2006.01) |

(52) U.S. Cl.
CPC ........... *H05K 1/028* (2013.01); *H05K 1/0283* (2013.01); *H05K 1/032* (2013.01); *H05K 1/189* (2013.01); *H05K 3/0014* (2013.01); *H05K 3/284* (2013.01)

(58) Field of Classification Search
CPC ...... H05K 1/028; H05K 1/0283; H05K 1/032; H05K 1/189; H05K 3/0014
See application file for complete search history.

(56) References Cited

U.S. PATENT DOCUMENTS

| | | |
|---|---|---|
| 9,706,646 B2 | 7/2017 | Jiang et al. |
| 10,057,981 B2 | 8/2018 | Lee |
| (Continued) | | |

FOREIGN PATENT DOCUMENTS

| | | |
|---|---|---|
| CN | 110430664 A | 8/2019 |

OTHER PUBLICATIONS

Tang, R., et al., "Origami-enabled deformable silicon solar cells", *Applied Physics Letters*, vol. 104, No. 8, pp. 083501-1-083501, (2014).

(Continued)

*Primary Examiner* — Binh B Tran
(74) *Attorney, Agent, or Firm* — Leydig, Voit & Mayer, Ltd.

(57) ABSTRACT

A flexible electronic device (SED) that can conform to a three-dimensional structure, and methods for manufacturing the SED, are disclosed herein. The SED comprises a flexible substrate which is modified in accordance with a folding pattern. The flexible substrate can be folded or unfolded along crease lines of the folding pattern, and the largest deformations of the substrate are localized at the crease lines. Various functional components of the SED are positioned on rigid regions of the substrate defined by the folding pattern. Such that the various functional components are protected from large deformations due to a folding or unfolding process, ensuring good performance of the functional components.

19 Claims, 10 Drawing Sheets

(56) References Cited

U.S. PATENT DOCUMENTS

| | | | |
|---|---|---|---|
| 10,153,519 | B2 | 12/2018 | Jiang et al. |
| 10,502,991 | B2 | 12/2019 | Yu et al. |
| 2017/0034907 | A1 | 2/2017 | Iwase et al. |
| 2017/0338453 | A1* | 11/2017 | Yu .................. H01L 21/561 |
| 2018/0301808 | A1* | 10/2018 | Olsen ............... H01Q 21/0025 |

OTHER PUBLICATIONS

Huang, Z., et al., "Three-dimensional integrated stretchable electronics", *Nature Electronics*, vol. 1. No. 8, pp. 473-480 (2018).

Gray, D.S., et al. "High-Conductivity Elastomeric Electronics", *Advanced Material*, vol. 16, No. 5, pp. 393-397 (Mar. 5, 2004).

Kim, Hyun-Joong, et al., "A multiaxial stretchable interconnect using liquid-alloy-filled elastomeric microchannels", *Applied Physics Letters*, vol. 92, 011904, (2008).

Li, Teng, et al., "Complaint thin film patterns of stiff materials as platforms for stretchable electronics", *Journal of Materials Research*, vol. 20, No. 12, pp. 3274-3277 (2005).

Lee, W., et al., "Two-dimensional materials in functional three-dimensional architectures with applications in photodetection and imaging", *Nature Communications*, Article Vol., p. 9 (Apr. 2018), Art No. 1417.

Zhang, Y.H., et al., "Mechanics of stretchable batteries and supercapacitors", *Current Opinion in Solid State & Materials Science*, vol. 19, pp. 190-199, (2015).

Song, Z., et al. "Origami lithium-ion batteries", *Nature Communications*, vol. 5, pp. 1-6, 3140 (2014).

Lynd, D.T., et al., "Strategies to predict radiated sound fields from foldable, Miura-ori-based transducers for acoustic beamfolding", *Journal of the Acoustical Society of America*, vol. 141, No. 1, pp. 480-489 (2017).

Gardner, J.P., et al. "The James Webb Space Telescope", *Space Science Reviews*, vol. 123, No. 4, pp. 485-606 (2006).

Hanna, B.H., et al., "Waterbomb base: a symmetric single-vertex bistable origami mechanism", *Smart Materials and Structures*, vol. 23, No. 9 (2014).

Tai, King L., et al., "System-In-Package (SIP): Challenges and Opportunities", *In Proceedings 2000, Design Automation Conference*, (IEEE Cat. No. OOCH37106), pp. 191-196 (2000).

Schenk, M., "Geometry of Miura-folded metamaterials", *Proceedings of the National Academy of Sciences*, vol. 110, No. 9, pp. 3276-3281 (Feb. 26, 2013).

Kim, Mijung, et al., "Fully-Integrated, bezel-less transistor arrays using reversibly foldable interconnects and stretchable origami substrates", *Nanoscale*, 8, pp. 9504-9510 (Mar. 16, 2016).

Ji, Sangyoon, et al., "Photo-patternable and transparent films using cellulose nanofibers for stretchable origami electronics", *NPG Asia Materials*, 8, pp. 1-9 (Aug. 26, 2016).

Yoon, J., et al., "Soft Modular Electronic Blocks (SMEBs): A Strategy for Tailored Wearable Health-Monitoring Systems", *Advance Science*, vol. 6, No. 5, pp. 1-8, 1801682 (Mar. 6, 2019).

Hong, Y.J., et al., "Wearable and Implantable Devices for Cardiovascular Healthcare: from Monitoring to Therapy based on Flexible and Stretchable Electronics", *Advanced Functional Materials*, vol. 29, No. 19, pp. 1-26, (2019).

Vieroth, R., et al., "Stretchable Circuit Board Technology and Application", *IEEE Explore*, pp. 33-36, (Sep. 22, 2009).

Yamamoto, D., et al., "A Planar, Multisensing Wearable Health Monitoring Device Integrated with Acceleration, Temperature, and Electrocardiogram Sensors", *Advanced Materials Technologies*, vol. 2, vol. 7, pp. 1-8, (Jul. 2017).

Byun, J., et al., "A Single Droplet-Printed Double-Sided Universal Soft Electronic Platform for Highly Integrated Stretchable Hybrid Electronics", *Advanced Functional Materials*, vol. 27, No. 36, pp. 1-12, (2017).

Xiang, X.M., et al., "Large Deformation of an Arc-Miura Structure Under QuasiStatic Load", *Composite Structures*, Article vol. 182, pp. 209-222, (2017).

Tsuda, S., et al., Translated "Design of Deployable Bar Structure Developed from Yoshimura-Pattern Rigid-Origami", *AU Journal of Technology and Design*, vol. 24, No. 56, pp. 111-116 (2018).

Brown, Kenneth M., System in Package "The Rebirth of SIP" in *Proceedings of the IEEE 2004 Custom Integrated Circuits Conference* (IEEE Cat. No. 04CH37571), pp. 681-686 (2004).

Iwata and E. Iwase, "Stress-Free Stretchable Electronic Device Using Folding Deformation," in *Proc. 2017 IEEE 30th International Conference on Micro Electro Mechanical Systems* (MEMS), Las Vegas, NV, USA, pp. 231-234, (2017).

* cited by examiner

ORIGAMI-BASED STRETCHABLE ELECTRONIC DEVICE AND METHODS FOR THEIR MANUFACTURE

CROSS-REFERENCE TO RELATED APPLICATIONS

This application claims priority to U.S. Provisional Application No. 63/101,565, filed on May 5, 2020, which is hereby incorporated by reference in its entirety.

TECHNICAL FIELD

The application relates to electronic packaging technology. More specifically, the application is directed to a stretchable electronic device.

BACKGROUND

Stretchable electronic circuits as an emerging new technology in the past decade provide high market potential for applications utilizing stretchable electronic devices (SEDs). Such applications may include wearable electronics and medical electronics. The stretchable electronic devices, which benefit from their three-dimensional conformability, may be stretched and contracted, to conform to the motion of joints or muscles, thus ensuring accuracy of sensing during the motion.

Conventional technologies typically follow at least one of the following routines: (1) by implementing novel materials, and (2) by implementing novel structures. A variety of materials have been used for fabricating the SEDs, such as elastic polymer substrates as well as composite and liquid conductors. However, novel materials may experience several limitations. Firstly, the specially-developed novel materials may pose difficulties in mass production. Secondly, novel materials such as polymeric conductive materials perform poorly as conductive interconnects both electrically and mechanically due to excessive impedance and short lifetime compared to metallic interconnects. Thirdly, an interface between rigid and stretchable regions of the substrate after implementing the novel materials may be challenged with long-term reliability.

As an example of a developed structure, a substrate may be made of an array of rigid "islands" and interconnects with a wavy or serpentine pattern that connect the array of rigid "islands" to form a stretchable circuit. Such structure may allow the patterned substrate to experience strain or stress on specific regions. From a macro perspective, the overall device may be stretchable due to the wavy or serpentine interconnects. From a micro perspective, the stress or strain at the solder joints on the rigid islands may be reduced, which improves the lifetime of the device. However, the complex structure of the wavy or serpentine patterned interconnects may require complicated manufacturing processes and thus may not be compatible with traditional industrial production. In addition, integration of various functional components on SEDs based on new structures may also be challenged.

Solutions to the aforementioned issues are needed to develop new stretchable electronic devices.

SUMMARY

A stretchable electronic device (SED) and methods for manufacturing the SED are disclosed in the following detailed description. The SED may include a flexible substrate integrated with a plurality of functional components, which are electrically connected. The flexible substrate of the SED may be folded in accordance with an origami or kirigami folding pattern. These types of three-dimensional structures can enable deformability or stretchability of the SED. The disclosed manufacturing techniques may allow for mass production on a conventional planar substrate to produce such SEDs with an extended long lifetime due to decreased local concentration of stress or strain.

In accordance with one aspect of the present disclosure, an electronic device is disclosed. The electronic device includes a flexible substrate and a plurality of functional components integrated on the flexible substrate. The flexible substrate is folded into a three-dimensional structure in accordance with an origami or a kirigami pattern. The functional components are electrically connected.

In some embodiments, the flexible substrate comprises a plurality of rigid regions and at least one flexible interconnect, and the at least one flexible interconnect connects the plurality of rigid regions. The functional components are mounted on the rigid regions.

In some embodiments, at least one portion of the flexible substrate is removed, and the at least one portion removed from the flexible substrate is removed adjacent to a vertex of a rigid region of the folding pattern.

In some embodiments, the flexible substrate is embedded with connecting lines or hybrid microcircuits.

In some embodiments, the flexible substrate comprises Parylene.

In some embodiments, the flexible substrate is encapsulated within or covered by a protective layer.

In some embodiments, the electronic device is stacked on another substrate. The other substrate is folded into an identical three-dimensional structure of the electronic device.

In yet another aspect of the present disclosure, a method is disclosed for manufacturing a stretchable electronic device. The method includes the steps of: patterning a two-dimensional substrate in accordance with a folding pattern, integrating a plurality of functional components on the two-dimensional substrate, modifying a rigidity of the two-dimensional substrate in accordance with the folding pattern, and folding the two-dimensional substrate to a three-dimensional structure. The folding pattern comprises a plurality of rigid regions and at least one interconnect.

In some embodiments, modifying the rigidity of the two-dimensional substrate in accordance with the folding pattern includes applying pressure to the at least one interconnect of the folding pattern.

In some embodiments, modifying the rigidity of the two-dimensional substrate in accordance with the folding pattern includes attaching a plurality of stiffeners to the rigid regions of the folding pattern.

In some embodiments, the method further includes removing at least one portion of the two-dimensional substrate.

In some embodiments, the at least one portion of the two-dimensional substrate is removed from the at least one interconnect. The method further includes coating the two-dimensional substrate with a layer of flexible material to form a new interconnect within the layer of flexible material.

In some embodiments, the method further includes encapsulating the folded substrate with an encapsulation material.

In yet another aspect of the present disclosure, a method is disclosed for manufacturing a stretchable electronic device. The method includes: patterning a two-dimensional substrate in accordance with a folding pattern, modifying rigidity of the substrate in accordance with the folding pattern, integrating a plurality of functional components on the two-dimensional substrate, and folding the two-dimensional substrate to a three-dimensional structure. The folding pattern comprises a tessellation of parallelograms.

In some embodiments, the method further includes modifying the rigidity of the substrate after integrating the plurality of functional components on the two-dimensional substrate.

In some embodiments, modifying the rigidity of the two-dimensional substrate in accordance with the folding pattern includes attaching a plurality of stiffeners to the parallelograms of the folding pattern.

In some embodiments, creased regions of the substrate are designed to have fewer layers, fewer traces, or thinner layers than the rest of the substrate.

In some embodiments, the method further includes removing at least one portion of the substrate.

In some embodiments, the removed portion of the substrate is at a creased region of the substrate. The method further includes coating the substrate with a layer of flexible material to form a new interconnect with the layer of the flexible material.

In some embodiments, the method further includes encapsulating the folded substrate with an encapsulation material.

DETAILED DESCRIPTION

Figure 1A:
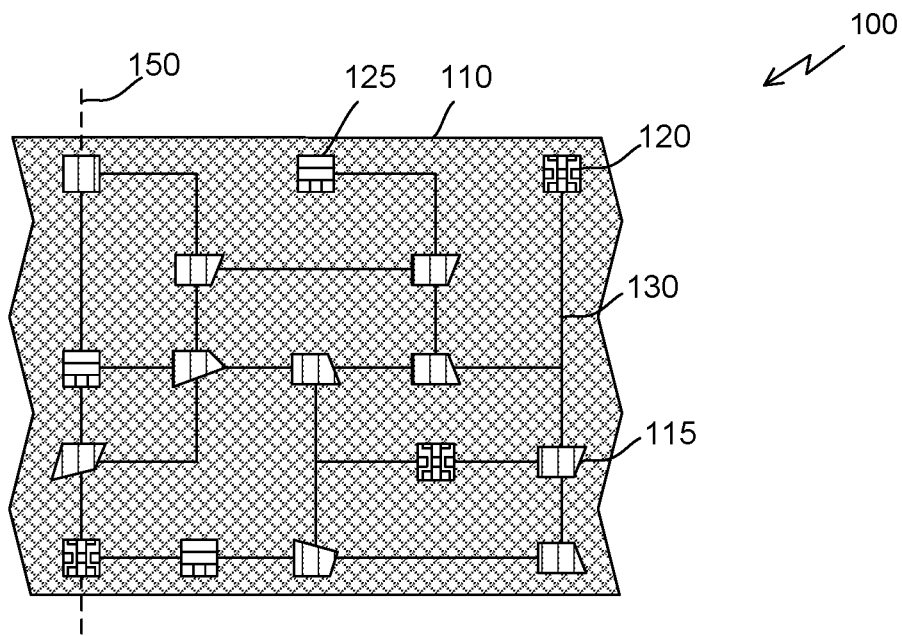
FIGS. 1A-1D illustrate an origami-based SED at an unfolding state, in accordance with some embodiments.

The present disclosure is directed to a stretchable electronic device (SED). The SED may be fabricated by integrating various functional components on a flexible substrate, which may be folded in accordance with a folding pattern. The flexible substrate may comprise a plurality of rigid regions and at least one flexible interconnect. The at least one flexible interconnect may allow the substrate to be folded according to the designed folding pattern such as a Miura-ori pattern, thus enabling deformability and stretchability of the SED. The functional components may be positioned on the rigid regions, which may deform less than the interconnect regions during a folding/unfolding process. Thus, the stress or strain may be localized, to an extent, to the interconnect regions rather than the rigid regions. As a result, the integrated functional components may work properly despite the folding status of the SED.

In some embodiments, the substrate of the SED may be designed with specific patterns to promote folding of the device. For instance, the interconnect regions of the substrate may be pressured with external forces, specifically designed with fewer layers, removed with certain portions, or replaced with a more flexible material to enhance flexibility of the interconnect regions. As another approach, the rigid regions of the substrate may be strengthened. For instance, a plurality of stiffeners may be attached to the rigid regions of the substrate to enhance rigidity.

The techniques of fabricating SEDs described herein may be compatible with commonly used two-dimensional substrates, such as circuit boards and integrated circuits, allowing for wide applications of the techniques. Further, the techniques may also be compatible with conventional manufacturing technologies, allowing for mass production.

The produced SEDs may have a planar initial-state. When in use, the SEDs can be converted into a three-dimensional structure according to the folding structure by self-assembly or by applying external forces. The resulting three-dimensional working-state SEDs may have the advantages of a smaller projection area, higher portability, deformability, and stretchability. Furthermore, with the capability of repeatedly folding and unfolding, the origami-based products may serve as an excellent platform for foldable, flexible, stretchable, or curvilinear electronics. Additionally, due to the redistributed stress or strain in the origami-based three-dimensional structure, such SED produces may benefit with an extended lifetime.

While the description below predominantly describes the embodiments with reference to a Miura-ori folding pattern invented by Koryo Miura circa 1993, it will be appreciated that other types of origami structures having even higher space utilization when folded are within the scope of the present disclosure. The type of folding pattern that is selected may be tailored to the application. Moreover, other origami or kirigami patterns, such as Huffman's tessellations, Tachi's rigid-foldable quadrilateral mesh patterns, can also be used with this technology if they are the variations of Miura-ori.

Figure 1B:
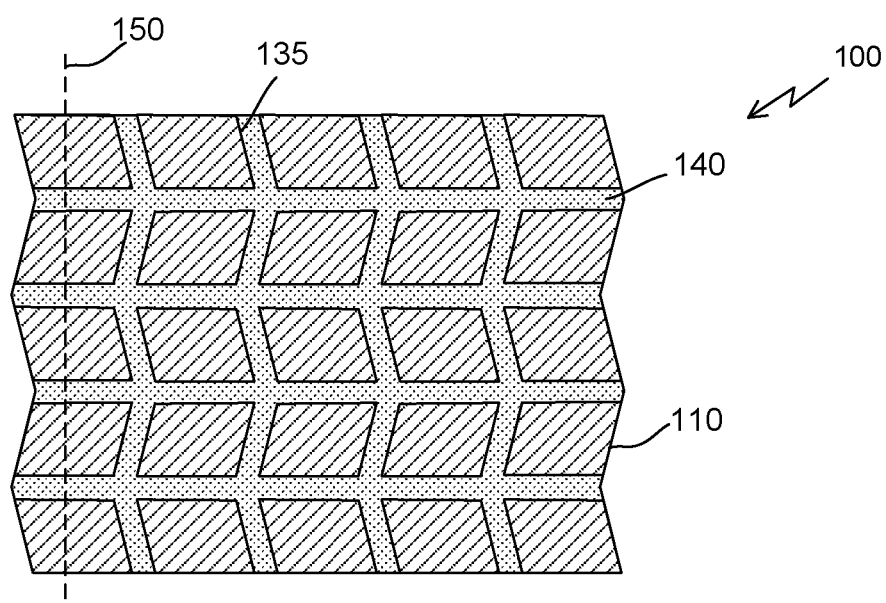
Figure 1C:
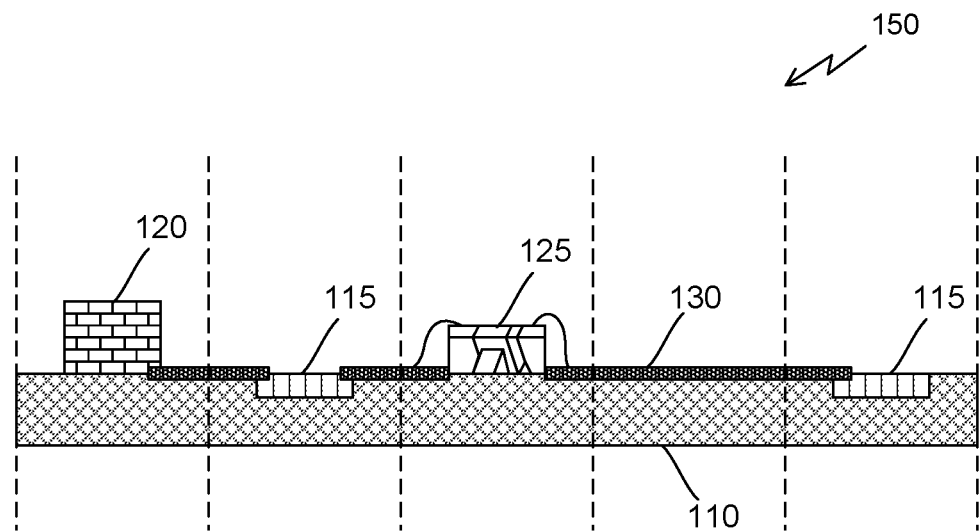
Figure 1D:
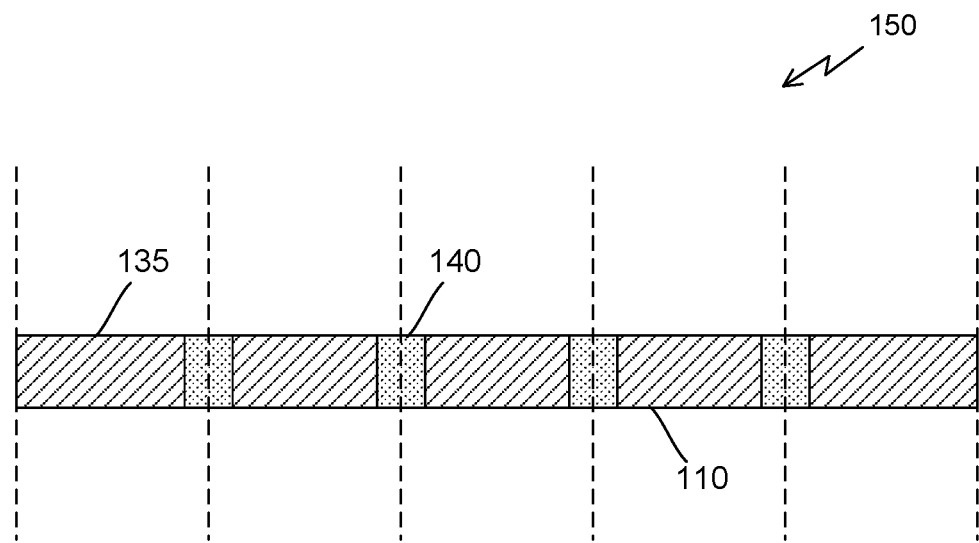

FIGS. 1A and 1B illustrate a top view of an origami-based SED 100 at an initial unfolding state, from a functional perspective and a structural perspective respectively, in accordance with some embodiments. FIGS. 1C and 1D illustrate a cross section view at a cutting line 150 in the origami-based SED 100 for FIGS. 1A and 1B, respectively.

As depicted in FIG. 1A, the origami-based SED 100 may include a substrate 110 and various functional components which are electrically connected on the substrate 110. The functional components may include hybrid microcircuits 115, packaged functional components 120 and chips 125, which may be connected by connecting lines 130. The standard technologies to connect the packaged electronic components 120 and the chips 125 with the substrate 110 may be soldering, flip-chip bonding, and wire-bonding.

The substrate 110 may provide not only mechanical support and electrical pathway for the various functional components, but also deformability and flexibility for the origami-based SED 100 due to a specifically designed folding structure in accordance with a folding pattern. The substrate 110 may fold from a two-dimensional plane to a three-dimensional structure along a number of crease lines of the designed folding pattern. As depicted in FIGS. 1A and 1B, the left and right edges of substrate 110 may be zigzag paths of crease lines. In some embodiments, the crease lines may form a tessellation of parallelograms on a two-dimensional surface of the substrate 110 that, when folded, form a series of peaks and valleys that can be referred to as a Miura fold or Miura-ori in Japanese. The Miura fold crease pattern may allow for a folding/unfolding of the substrate 110 to be carried out in a continuous motion, while each parallelogram may be substantially flat during the folding/unfolding process. Thus, the stress introduced by the folding/unfolding may be localized to the crease lines. The functional components may be integrated on the parallelograms of the Miura fold crease pattern to reduce strain to the working functional components during the folding/unfolding process. On the other hand, the foldable structure may enable an overall deformability and flexibility to the origami-based SED 100.

It will be appreciated that substrate 110 may be a rigid substrate, a foldable substrate or a flexible substrate. Further, substrate 110 may be a material, structure, device, or the like manufactured as a substantially planar shape using conventional industrial technology. In some embodiments, connecting lines 130 and hybrid microcircuits 115 may be embedded in substrate 110.

Each hybrid microcircuit 115 may be a microcircuit that contains two or more of a single type, or a combination of the following microcircuits or elements: a film microcircuit, a monolithic microcircuit, a semiconductor element, a passive element, and a printed or deposited substrate element. A film microcircuit refers to a microcircuit consisting of elements which are exclusively films formed in-situ upon or within an insulating substrate. A monolithic microcircuit refers to an active microcircuit consisting of elements which are exclusively formed in-situ or within a single semiconductor substrate with at least one of the elements formed within the substrate. A semiconductor element refers to an active semiconductor element other than a microcircuit. For instance, the semiconductor element may include, but is not limited to, a transistor, a diode, or a thyristor. A passive element refers to a passive semiconductor element, such as a planar resistor, a capacitor, an inductor, or a single layer, or a multilayer patterned substrate.

The packaged electronic component 120 may be any primary discrete device or physical entity with an electronic packaging in an electronic system used to affect electrons or their associated fields. Components can be classified as passive, active, or electromechanical ones. Active components rely on a source of energy and usually can inject power into a circuit. Active components include amplifying components such as transistors, triode vacuum tubes (valves), and tunnel diodes. Unlike active components, passive components do not rely on a source of power, but rather on the power available from an analog circuit (AC) to which the passive components are connected. Nor do passive components introduce net energy into the circuit. As such, passive components cannot amplify a signal by increasing power of the signal, although passive components may increase a voltage or current of the signal, for instance, by using a transformer or a resonant circuit. A passive component may be a two-terminal component such as a resistor, a capacitor, an inductor, or a transformer. An electromechanical component may carry out electrical operations by using moving parts or by using electrical connections.

The chip 125 may be any primary discrete device or physical entity used in an electronic system to affect electrons or their associated fields. Unlike a packaged electronic component, a chip 125 does not have any electronic packaging, in other words, a chip is a bare die. A bare die product is simply a piece of package-free wafer. The bare die product may allow a system designer to use the full potential of the bare electrical die without incurring the penalties, such as degraded electrical performance or temperature limitation, that can result from the using the product in a standard package format. A chip may be a power metal-oxide-semiconductor field-effect transistor (MOSFET), an insulated-gate bipolar transistor (IGBT), a small signal discrete device such as a bipolar junction transistor (BJT) and a junction-gate field-effect transistor (JFET), an integrated circuit, or a thin film passive chip, such as a thin-film resistor, capacitor or inductor.

The connecting lines 130 may be any type of conductors connecting hybrid microcircuits 115 and predesigned pads. The predesigned pads may be used for mounting or bonding packaged electronic components 120 and/or chips 125 on the substrate 110.

FIG. 1B illustrates the origami-based SED 100 from a structural perspective. The origami-based SED 100 may include a plurality of rigid regions 135 and at least one interconnect 140. The rigid regions 135 may be maintained as flat planes during a folding/unfolding process. The at least one interconnect 140, which corresponds to crease lines of the folding pattern, may be modified with more flexibility comparing to the rigid regions 135. Such that the at least one interconnect 140 may be promoted to fold according to the folding pattern. In such embodiment, the stress caused by a folding/unfolding process may be localized at the at least one interconnect 140. In order to extend a lifetime of the SED from folding/unfolding, the rigid regions 135 and the at least one interconnect 140 of the substrate 110 may be designed to manage the distribution of the stress. Functional components may be positioned on portions of the substrate 110 that are affected by the folding stress less than other portions of the substrate 110. Meanwhile the portions of the substrate 110 under large stress during the folding/unfolding process may be removed or reinforced. As such, the lifetime of the SED may be significantly extended. It will be appreciated that the rigid regions 135 and the at least one interconnect 140 may be the same material or different materials. The rigid regions 135 may be made of a flexible material or a rigid material. A number of techniques described hereinafter may be applied to modify the rigidity of the substrate.

In a Miura-ori pattern, the plurality of rigid regions 135 may be parallelograms. Each rigid region 135 may have a plurality of side edges. The plurality of rigid regions 135 may be arrayed in a predetermined pattern. The plurality of side edges may define a plurality of creases in the predetermined pattern, and at least one side edge of each rigid region 135 may be positioned in opposition to at least one side edge of another rigid region 135 in the predetermined pattern. At least one interconnect 140, which is a connecting portion, may be coupled to and positioned between the opposed rigid regions 135. Each rigid region 135 may comprise a piece of substrate. In some embodiments, the rigid regions 135 may be shaped and sized to correspond to a desired origami shape, with the side edges of the rigid regions 135 corresponding to creases in accordance with an origami folding pattern.

Connecting lines 130, hybrid microcircuits 115, packaged electronic components 120, and chips 125 may be positioned on the rigid regions 135. A connecting line 130 may connect two functional components on separate rigid regions 135 in an embodiment. In such embodiments, at least part of the connecting line 130 may be on the interconnect 140. The portion of the connecting line 130 on the interconnect 140 may be deformed during the folding/unfolding process.

As for the interconnects 140 described herein, at least one connecting portion may be coupled to and positioned between the opposed rigid regions 135. In one aspect, each interconnect 140 may be in a fixed position, in which no relative movement between connected rigid regions 135 can be allowed. In another aspect, each interconnect 140 may be movable and pliable to allow for relative movement between connected rigid regions 135. The at least one interconnect 140 may be relatively more flexible than the connected rigid regions 135, so that each of the plurality of rigid regions 135 can be folded or unfolded, and the overall origami-based SED 100 may be deformable and stretchable.

Rigidity of the substrate 110 may be modified by adopting at least one of the two strategies: (1) to strengthen rigidity of the rigid regions 135, and (2) to enhance flexibility of the at least one interconnect 140. Each of the strategies may involve two levels of considerations. One of the considerations may be at a design level to address the requirements for a planar device to be folded into a three-dimensional structure. For instance, an enhancement to the design of the Miura-ori folding pattern may be considered to achieve folding of a given planar board into a Miura-ori based stretchable circuit board (SCB). Different enhancement techniques may be implemented, depending on the applications, functional components to be integrated, material of the substrate and other requirements. The other consideration may be at a fabrication level to select a suitable technique for folding the planar substrate. As will be described in details hereinafter, processes such as direct folding and replacing the material of the interconnect may be applied during the fabrication. Typically, quality of the product is a tradeoff of complexity of the fabrication process. Selection of a suitable technique for fabrication may be dependent on the requirements of a quality of the product, cost, turnaround time and some other factors.

It will be appreciated that a Miura-ori pattern is described herein as illustrative for a better understanding of the origami-based SED 100. Other patterns utilizing the methodology of "origami" or "kirigami" to achieve an SED may also be implemented.

FIGS. 1C and 1D illustrate a cross section for cutting line 150 of the origami-based SED 100 from a functional perspective and a structural perspective, respectively. As depicted in FIG. 1C, a portion of the substrate 110 is presented in the cross section for the cutting line 150. two hybrid microcircuits 115 are embedded in the substrate 110, a packaged electronic component 120 is mounted on the substrate 110, a chip 125 is wire-bonded on the substrate 110, and electrical connections are established by the connecting lines 130. In some embodiments, the substrate 110 may comprise multiple layers. For instance, the substrate 110 may be a PCB, which may comprise one or more sheet layers of copper for conduction. As illustrated in FIG. 1D, the hybrid microcircuits 115, the packaged electronic component 120, the chip 125 and part of the connecting lines 130 are positioned on the rigid regions 135. In the cross section, the plurality of the rigid regions 135 are separated by portions of the interconnect 140. Connecting lines 130 that connects functional components on separate rigid regions 135 are partially on the interconnect 140. For instance, the connecting line 130, that connects the rightmost hybrid microcircuit 115 and the chip 125, may be on multiple rigid regions 135 and serval portions of the interconnect 140. Specifically, a portion of the connecting line 130 may be across an entire rigid region 135. The portions of the connecting lines 130 on the interconnect 140 may be deformed following the deformation of the interconnect 140 during the folding/unfolding process.

The aforementioned origami-based SED may be produced as a SED with a planar initial-state. When in use, the planar initial-state SEDs may be conformed into a three-dimensional structure in accordance with an origami-based folding pattern. The three-dimensional folding structure of the SED may be realized by self-assembly or external forces. The resulting three-dimensional working-state SEDs can provide a smaller projection area, higher portability, higher deformability, and higher stretchability. Furthermore, with the capability of repeatedly folding and unfolding, the origami-based products may provide an excellent platform of foldable, flexible, stretchable, or curvilinear electronics with an extended lifetime of such products due to the redistributed stress or strain. Still further, the folded configuration of an origami-based SED may be characterized by parameterization according to the folding pattern.

Figure 2A:
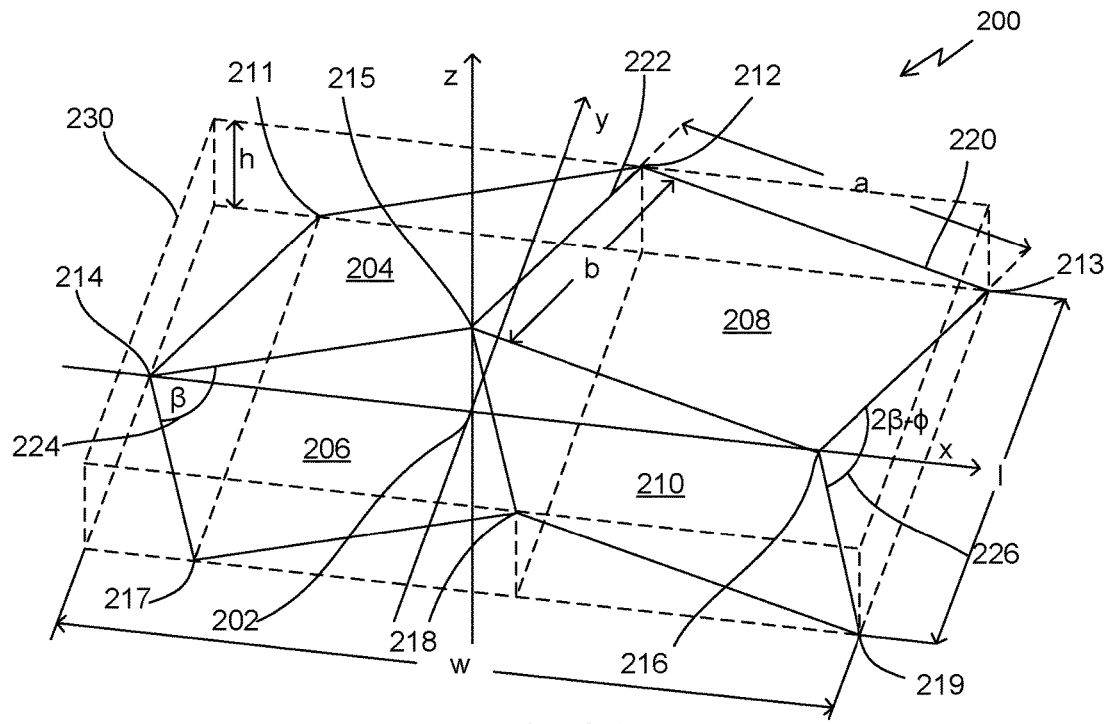
FIGS. 2A-2B illustrate a parameterization of a Miura-ori pattern, in accordance with some embodiments.

FIG. 2A illustrate a parameterization for a basic unit 200 of a Miura-ori pattern in accordance with some embodiments. Basic unit 200 may be defined as a cell of the Miura-ori pattern. Cell 200 may be presented in a three-dimensional space defined by an x-axis, a y-axis, a z-axis and an origin 202. Points 211, 212, 213, 214, 215, 216, 217, 218, and 219 are the vertexes of cell 200 in the Miura-ori pattern, which may be used to describe other objects. Cell 200 may include four identical parallelograms 204, 206, 208 and 210. Parallelogram 204 may be defined by points 211, 212, 215 and 214. Parallelogram 206 may be defined by points 214, 215, 218 and 217. Parallelogram 208 may be defined by points 212, 213, 216 and 215. Parallelogram 210 may be defined by points 215, 216, 219 and 218.

The unfolded pattern of cell 200 may be entirely defined by three parameters: side lengths 220 and 222, which may be denoted as parameters a and b respectively, and sector angle 224, which may be denoted as a parameter β. Parameter a is the length of one side of a parallelogram, which may be projected to a plane defined by the x-axis and y-axis. Parameter b is the length of another side of the parallelogram, which may also be projected to the plane defined by the x-axis and y-axis. Parameter β is an angle between two sides of a parallelogram. For example, the two sides may be one line defined by points 214 and 215 and another line defined by points 214 and 217 for parallelogram 206. Parameter β may be an acute angle or right angle. The folded configuration of cell 200 may be determined by a folding angle ϕ, which ranges from 0 degree to 2β. The folding angle is 0 degree, when cell 200 is unfolded. The folding angle is 2β when cell 200 is fully folded. An angle 226 between the line defined by points 213 and 216 and the line defined by points 219 and 216 may have a value (β−2ϕ). With known parameters a, b, β, and ϕ, all the other variables of a cell may be determined in any folded configuration.

A smallest box 230 may be defined as a three-dimensional space that may completely cover cell 200 of the Miura-ori pattern. Three sides at each vertex of the smallest box 230 may be parallel to the three coordinate axes. In this embodiment, width of the smallest box 230 may be along the x-axis, length of the smallest box 230 may be along the y-axis, and height of the smallest box 230 may be along the z-axis. The length of the smallest box 230, denoted as l, may be calculated by $$l = 2b\sin\left(\beta - \frac{\phi}{2}\right). \quad \text{(Eq. 1)}$$

The width of the smallest box 230, denoted as w, may be calculated by $$w = \frac{2a\cos\beta}{\cos\left(\beta - \frac{\phi}{2}\right)}. \quad \text{(Eq. 2)}$$

The height of the smallest box 230, denoted as h, may be calculated by $$h = \frac{a\sqrt{\sin^2\beta - \sin^2\left(\beta - \frac{\phi}{2}\right)}}{\cos\left(\beta - \frac{\phi}{2}\right)}. \quad \text{(Eq. 3)}$$

Figure 2B:
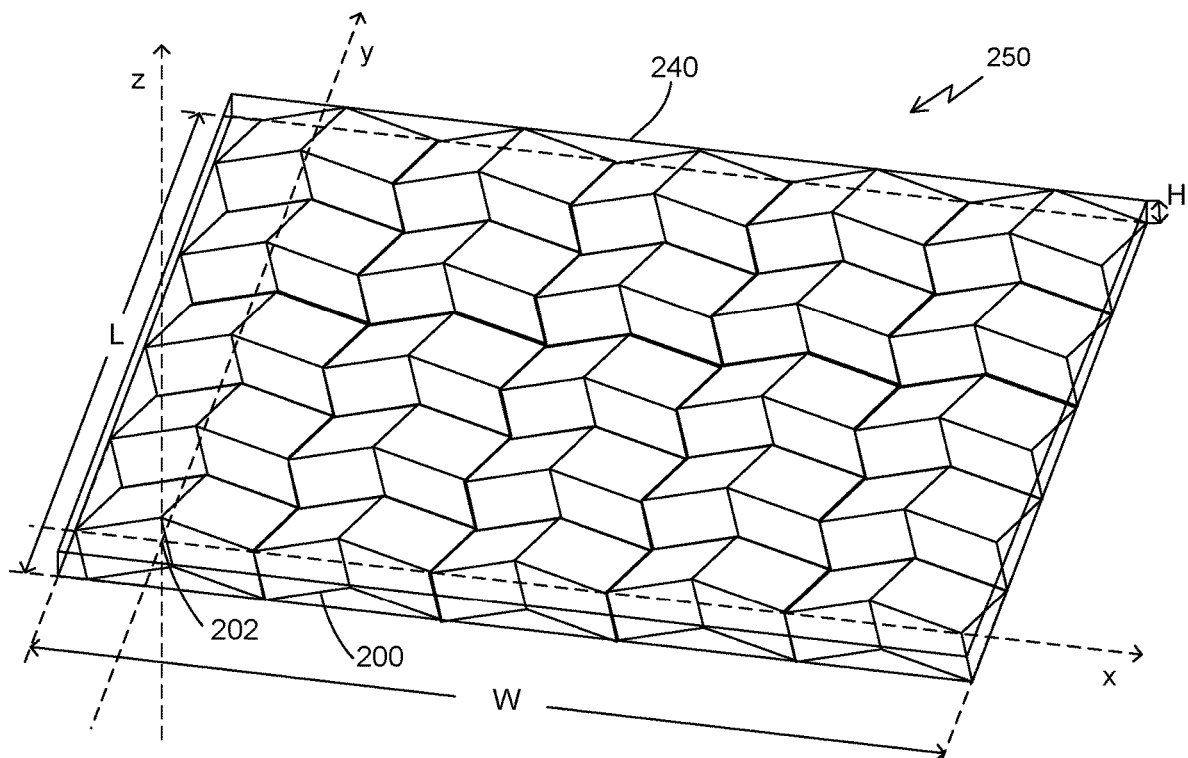

FIG. 2B illustrate a parameterization for a Miura-ori pattern 250 in accordance with some embodiments. Miura-ori pattern 250 may include a plurality of cells 200 of FIG. 2A, which may be arranged as an array of $N_l \times N_w$ parallelogram facets, where $N_w$ is the number of parallelograms along the x-axis and $N_l$ is the number of parallelograms along the y-axis. As an example, the Miura-ori pattern 250 may comprise 5×5 cells 200, such that both $N_l$ and $N_w$ may be 10. In case of $N_l$ or $N_w$ being an odd number, Miura-ori pattern 250 may not be formed by an integer number of cells 200. Each cell 200 in Miura-ori pattern 250 has a geometric configuration described in FIG. 2A. As such, a specific Miura-ori pattern configuration may be defined by only six independent parameters a, b, β, $N_l$, $N_w$ and ϕ. For a real application, the first five parameters are structural constants, which remains unchanged during folding and unfolding. The Miura-ori pattern configuration may be determined by only one variable ϕ. In other words, the Miura-ori pattern possesses a single Degree of Freedom (DOF).

Similar to the definition of the smallest box 230 for cell 200 of FIG. 1A, a smallest box 240 may be defined for Miura-ori pattern 250, such that the smallest box 240 may completely cover Miura-ori pattern 250. Width of the smallest box 240 may be along the x-axis, length of the smallest box 240 may be along the y-axis, and height of the smallest box 240 may be along the z-axis. The length of the smallest box 240, denoted as L, may be calculated by $$L = (N_l - 1) \times \frac{l}{2}. \quad \text{(Eq. 4)}$$

The width of the smallest box 240, denoted as W, may be calculated by $$W = (N_w - 1) \times \frac{w}{2} + b\cos\left(\beta - \frac{\phi}{2}\right). \quad \text{(Eq. 5)}$$

The height of the smallest box 240, denoted as H, may be calculated based on the following relationship, $$H = h. \quad \text{(Eq. 6)}$$

Linear deformability characteristics may be defined by the following expression, deformability=maximum value/minimum value−1 (Eq. 7)

Linear deformability characteristics for the y-axis and x-axis may be defined by the expressions for $\varepsilon_L$ and $\varepsilon_W$, respectively, $$\varepsilon_L = \frac{L_{max} - L_{min}}{L_{min}}, \quad \text{(Eq. 8)}$$

$$\varepsilon_W = \frac{W_{max} - W_{min}}{W_{min}}, \quad \text{(Eq. 9)}$$

where $L_{max}$ and $W_{max}$ are the maximum values of L and W on the unfold state, $L_{min}$ and $W_{min}$ are the minimum values of L and W on the fully folded state. The aforementioned equations derived for the Miura-ori pattern 250 depicted in FIG. 2B may be applied to characterize folding configurations of other types of Miura-ori-based SEDs. The aforementioned derivation of the overall deformation is an example for Miura-ori. Other crease patterns can be employed if they are variations of Miura-ori, and the dynamic dimensions should be evaluated case by case.

Figure 3:
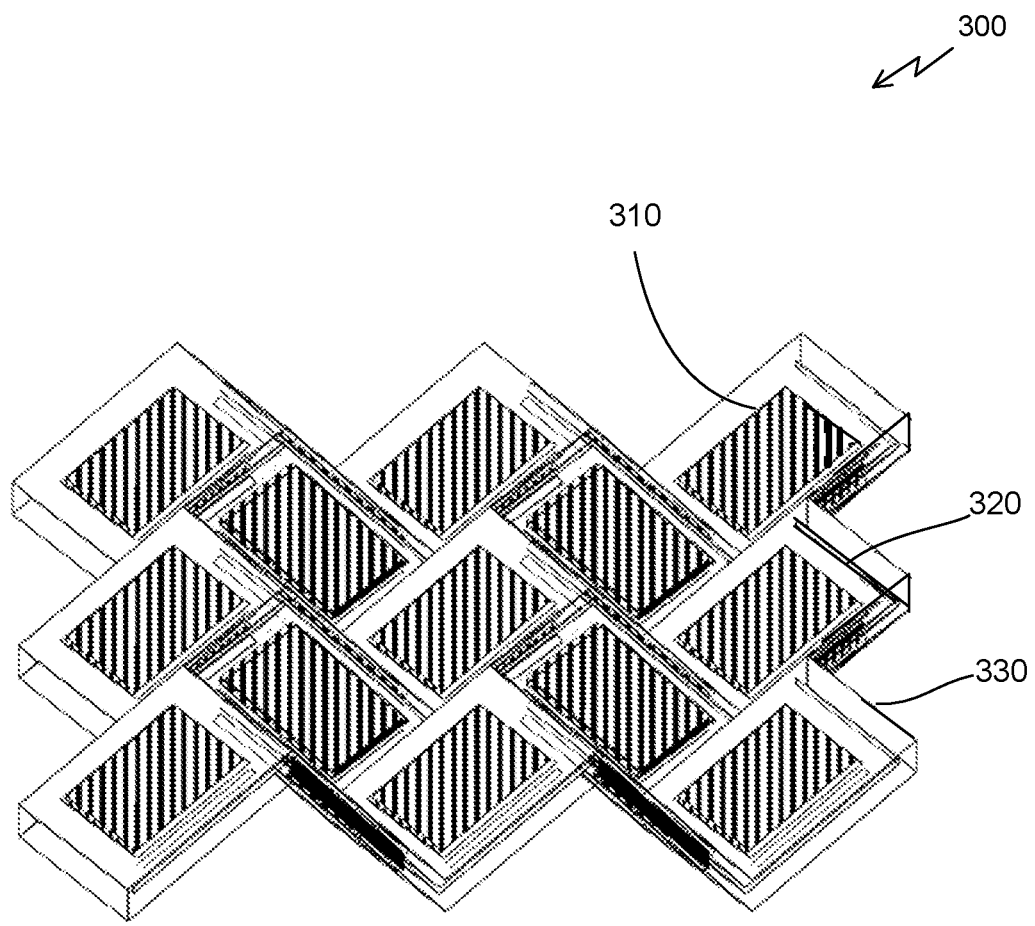
FIG. 3 illustrates an encapsulated Miura-ori-based SED, in accordance with an embodiment.

FIG. 3 illustrates an encapsulated Miura-ori-based SED 300 in accordance with an embodiment. If the thickness is ignored, the shape of the SED 300 follows a Miura-ori pattern. Parameter ϕ of the stretchable structures at the working state may vary in the range of 0 degree and 2β. The at least one interconnect 320 may be flexible so that each of the plurality of rigid structures 310 may be folded or unfolded, and the overall SED 300 may be deformable and stretchable. In this embodiment, the SED 300 is encapsulated by an encapsulation 330. In some embodiments, the encapsulation 330 may be made of a flexible and stretchable material with low Young's modulus (<500 MPa). In some embodiments, the encapsulation 330 may help maintain a desired folding configuration of the SED 300. Additionally, the encapsulation 330 may be a protective layer to protect the core components of SED 300. The protective layer may be made of Parylene-C, which is a common name for a polymer that includes benzenediyl rings ($C_6H_4$) connected by ethanediyl bridges ($CH_2$), or other type of flexible polymer. In other embodiments, the SED 300 may be covered by fabric materials, which serve as a protective layer. It will be appreciated that materials of the protective layer are not limited in this disclosure.

Figure 4:
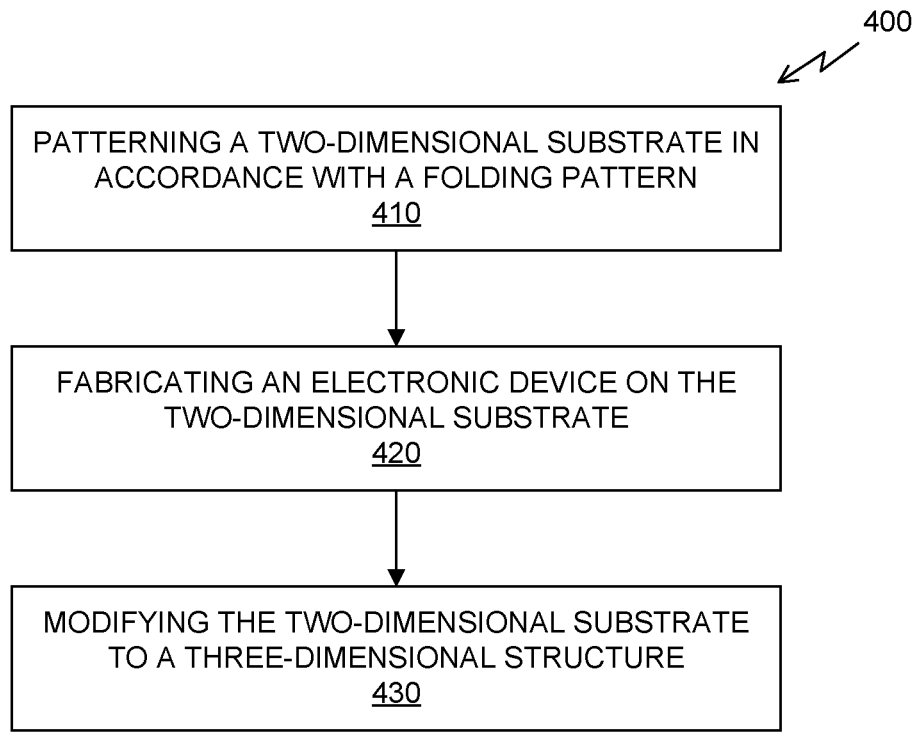
FIG. 4 illustrates a method for manufacturing an origami-based SED, in accordance with some embodiments.

FIG. 4 illustrates a method 400 for manufacturing an origami-based SED 100 in accordance with some embodiments. Process 400 may initially start with a two-dimensional substrate. Although the method 400 is described as being performed using conventional tools or equipment for semiconductor manufacturing, it will be appreciated that the any combination of tools or industrial equipment used to manufacture the SED 100 is within the scope of the present disclosure. Furthermore, steps of method 400 may be automated by one or more processors or controllers configured to execute instructions that cause the tools or equipment to implement various operations. The instructions can be included in a computer-readable medium such as a non-volatile or non-transitory memory.

At step 410, the two-dimensional substrate may be patterned in accordance with a folding pattern. During this step, the substrate may be defined with a plurality of rigid regions and at least one interconnect. The at least one interconnect may be defined based on crease lines of the folding pattern. In some embodiment, the substrate may comprise multiple laminated conducting layers, in which the conductive connections are part of the connecting lines according to the previous definition of the connecting lines.

At step 420, an electronic device may be fabricated on the two-dimensional substrate. The substrate may comprise hybrid microcircuits and connecting lines embedded therein and packaged electronic packages and chips mounted thereon. At least a portion of the electrical connections among the various functional components of the electronic device may be formed in this step.

At step 430, the two-dimensional substrate of the electronic device may be modified to form a three-dimensional structure. The rigidity of the substrate may be modified by at least one of the following manners: (1) strengthening the rigidity of the rigid regions, (2) weakening the rigidity of the interconnect, and (3) replacing the interconnects with a more flexible material.

In some embodiments, the order of steps 420 and 430 can be switched such that an electronic device may be fabricated on a three-dimensional substrate after the two-dimensional substrate is modified to conform to the three-dimensional structure.

In still other embodiments, step 430 can be performed prior to step 420, and another step 430 can be performed following step 420. Thus, an electronic device may be fabricated on a three-dimensional substrate after the two-dimensional substrate is modified to conform to the three-dimensional structure. The fabricated electronic device, which already has a three-dimensional structure, may be further modified to enhance the three-dimensional structure.

Figure 5:
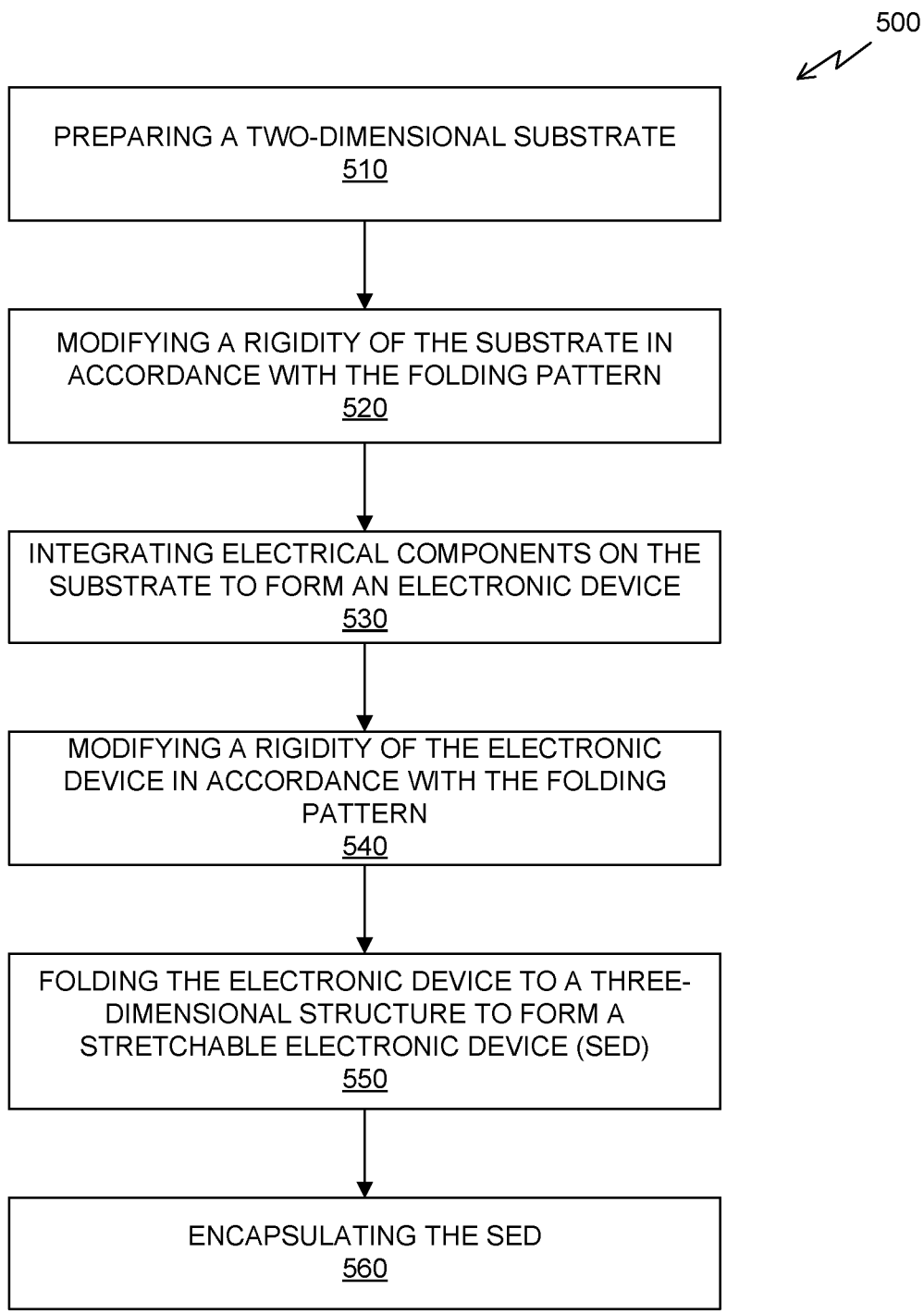
FIG. 5 is a flow diagram of a method for manufacturing an origami-based SED, in accordance with some embodiments.

FIG. 5 is a flow diagram of a method 500 for manufacturing an origami-based SED 100 in accordance with some embodiments.

At step 510, a two-dimensional substrate may be prepared. A folding pattern may be applied to a two-dimensional substrate to define a plurality of rigid regions and at least one interconnect. In an embodiment, a Miura-ori folding pattern is applied to the two-dimensional substrate, where the rigid regions may be plate regions that may be substantially flat when folded. The at least one interconnect may be defined based on the crease lines of the folding pattern and deformed when folded. Further in this step, the connecting lines and hybrid microcircuits may be fabricated on the substrate. In an embodiment, complementary metal-oxide-semiconductor (CMOS) processes such as photolithography, deposition, and implantation may be implemented in this step. In such embodiments, the initial substrate should be a CMOS process-compatible substrate, such as a silicon wafer. In another embodiment, connecting lines or some elements of the hybrid microcircuits may be fabricated by printing, electroplating or other processes.

At step 520, the rigidity of the substrate may be modified in accordance with the pre-defined folding pattern. This step may be performed by adopting a strategy of strengthening the rigidity of the rigid regions or enhancing the flexibility of the creased regions. Several techniques may be applied to modify the rigidity of the substrate according to at least one of the strategies mentioned above.

In one embodiment, pre-designed stiffeners may be attached to the rigid regions of the substrate such that the rigidity of the rigid regions may be strengthened. In another embodiment, a specific design may be applied to creased regions of the substrate to weaken the rigidity of the creased regions. For instance, the substrate may be a FPCB that comprises an interconnect. The interconnect may be designed with fewer layers, fewer traces, or at least one thinner layer. Such that the interconnect of the substrate may be promoted with more flexibility. In still another embodiment, at least one portion of an interconnect may be removed to enhance flexibility of the interconnect. For instance, a portion of an interconnect near vertexes of rigid regions of a Miura-ori pattern may be removed, where such portion of the interconnect does not perform an electrical or a mechanical connection function. In still another embodiment, the creased regions of the substrate may be replaced with a more flexible material to form a more flexible interconnect. These techniques may be used individually or in combination. All the techniques disclosed herein may be applied to flexible or bendable substrates, such as flexible printed circuit boards (FPCBs). Some of the techniques may be applied to rigid substrates, such as silicon wafers, glass wafers and steel planes.

At step 530, an electronic device may be fabricated by integrating functional components on the substrate. The functional components, such as packaged electronic components and chips, may be mounted on the rigid regions of the substrate. Electrical connections among the packaged electronic components, chips, and previously integrated hybrid microcircuits of step 510 may be fully established in this step. As such an electronic device comprising various functional components may be produced based on a two-dimensional substrate.

At step 540, rigidity of the electronic device may be modified in accordance with the pre-defined folding pattern. Similar to step 520, a strategy of strengthening the rigidity of the rigid regions or enhancing the flexibility of the interconnect may be adopted to modify the rigidity of the electronic device. Similar techniques may be applied at this step, for instance, by attaching stiffeners to the rigid regions of the electronic device, removing at least one portion of the interconnect that is not performing an electrical or a mechanical connection function, or replacing the interconnect with a more flexible material. Additionally, an external force may be directly applied to the substrate of the electronic device to force the substrate to fold in accordance with the folding pattern. For instance, the force may be applied by mold press or by hand. At least one of the steps 520 and 540 should be performed to promote the folding process. In some embodiments, one of the steps 520 or 540 may be omitted.

At step 550, the electronic device may be folded into a three-dimensional structure in accordance with the folding pattern to form a SED. The folding process may be conducted by self-assembly or by applying an external force.

At step 560, the SED may be encapsulated. In an embodiment, the encapsulation is made of a flexible and stretchable material with Young's modulus less than 500 MPa. The encapsulation may be used to protect the core of the stretchable structure. Alternatively, the SED may be covered by fabric materials, which serve as a protective layer. It will be appreciated that materials of the protective layer are not limited in this disclosure.

The deformation of the flexible interconnect in the origami structures may provide the overall deformability and stretchability to the SED. Furthermore, the stress during a folding/unfolding process may be localized to the flexible interconnect, due to the modified distribution of the rigidity. As such connecting lines, hybrid microcircuits, packaged electronic components, and chips on the rigid regions may be protected from large deformations during the folding/unfolding process.

The following embodiments describe five techniques of modifying rigidity that may be implemented in steps 520 or 540. These techniques may be used individually or in combination according to different applications. All five techniques may be compatible with flexible or bendable substrates, while some techniques may also be compatible with rigid substrates.

The first technique is to strengthen the rigidity of the rigid regions of the substrate by attaching stiffeners. This technique may be applied to both steps 520 and 540. In an embodiment, a plurality of stiffeners may be attached to the rigid regions defined by the pre-defined folding pattern of step 510. The stiffeners may have an identical shape of the rigid regions defined in the folding pattern. For instance, the stiffeners may be of a same parallelogram shape as rigid regions 135 in FIG. 1B. The stiffeners may provide increased rigidity to the rigid regions of the substrate, so that the substrate may be promoted to fold in accordance with the designed folding pattern. This technique may be applied to a flexible or bendable substrate. Alternatively, at least the interconnect of the substrate should be flexible or bendable. This technique is a standard process for flexible circuit boards, thus may be readily available for production. Further, the technique may provide relatively high alignment accuracy due to the self-alignment effect of the technique.

Figure 6A:
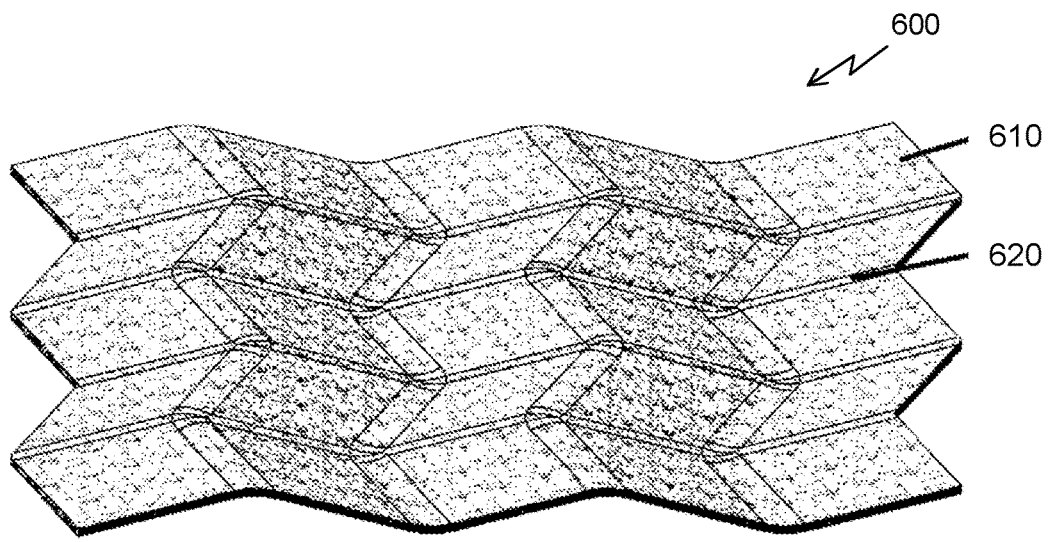
FIGS. 6A-6C illustrate three embodiments of weakening the rigidity of the crease regions of a substrate, in accordance with some embodiments.
Figure 6B:
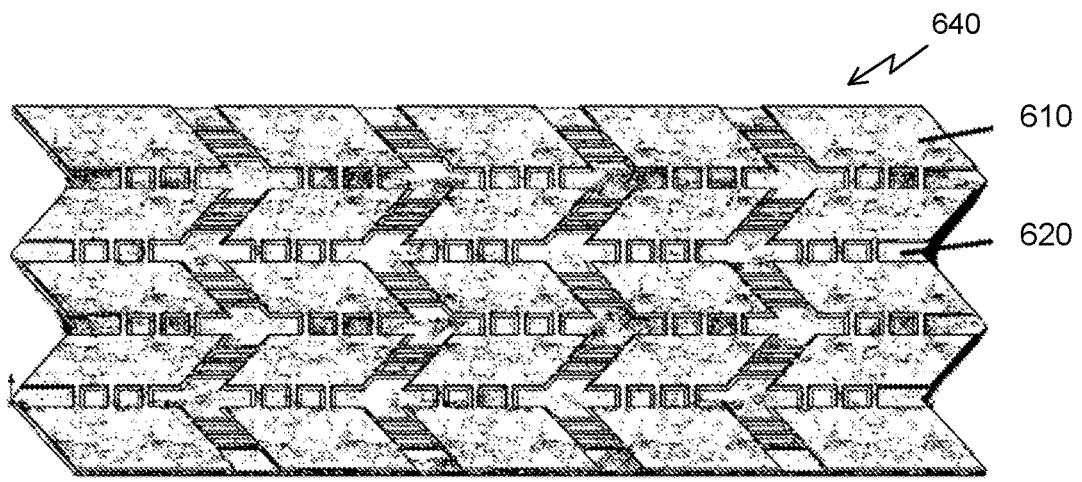
Figure 6C:
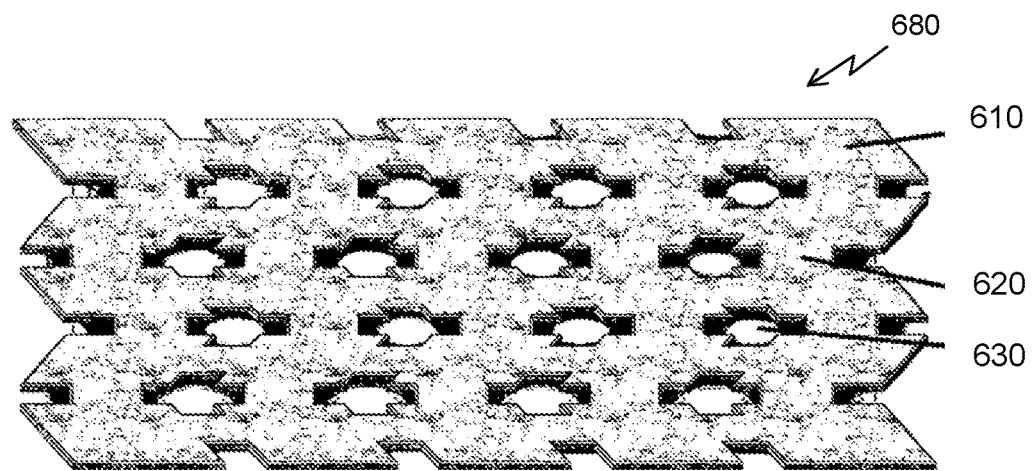

FIGS. 6A-6C illustrate three embodiments of weakening the rigidity of the crease regions of the folding pattern. The three embodiments describe the second, third and fourth techniques of the aforementioned five techniques.

FIG. 6A illustrates a substrate 600 of weakened rigidity of the crease regions corresponding to the second technique. The substrate 600 may be made of the same materials for the entire substrate. The substrate 600 may include a plurality of rigid regions 610 and one piece of continuous interconnect 620 to connect the plurality of rigid regions 610. The second technique is to weaken the rigidity of the interconnect 620 by directly applying a considerable amount of pressure to the substrate 600. Such pressure may be provided by machines or human hands. For instance, a mold press machine may be used to apply the pressure by molding the substrate. This technique may significantly change the flatness of the substrate, which may affect the integration of the functional components on the substrate 600 in step 540 of method 500. Thus, this technique may only be applied to step 550 of method 500. At least materials in the region of the interconnect 620 should be flexible or bendable. Micro-cracks may occur in the region of interconnect 620. Such micro-cracks may further increase the flexibility of the interconnect 620 due to a weakened rigidity of the cracked interconnect region. However, the micro-cracks may shorten the lifetime of the board as a tradeoff. The second technique may provide advantages such as low process complexity and no additional processing required. Additionally, the second technique may be easily combined with other techniques to further modify the rigidity of the substrate of the SED.

FIG. 6B illustrates a substrate 640 of weakened rigidity of the crease regions corresponding to the third technique. The substrate 640 may include a plurality of rigid regions 610 and a specifically designed interconnect 620. At least the interconnect 620 of the substrate 640 should be flexible (i.e., bendable or foldable). This third technique is to weaken the rigidity of the interconnect 620 by applying the specific design to the interconnect. For instance, when the substrate 640 is a flexible circuit board, the specific design may be fewer layers, fewer traces, or at least one thinner layer in the region of the interconnect 620. The third technique is to modify the rigidity at the design level, thus can only be implemented in step 530 of method 500. This technique also has the advantages of low process complexity and no additional processing required. Further, this technique may provide a higher alignment accuracy compared to the first and the second techniques.

FIG. 6C illustrates a substrate 680 of weakened rigidity of the crease regions corresponding to the fourth technique.

The substrate 680 may include a plurality of rigid regions 610 and a plurality of interconnects 620 to connect the rigid regions 610. Unlike the continuous interconnects as depicted in FIGS. 6A and 6B, a plurality of portions 630 of the substrate may be removed, thus separating the plurality of discrete interconnects 620. The fourth technique is to remove the portions 630 of the substrate 610. Such removed portions 630 of the substrate 610 may be determined by finding areas that are not performing the necessary electrical or mechanical connection function in the substrate. In an embodiment of a Miura-ori pattern, such areas may be crease regions that are near vertexes of the rigid regions 610. This technique may not reduce the flatness of the substrate, thus may be implemented in both steps 530 and 550 of method 500. The interconnects 620 should be made of flexible or bendable materials and serve as the electrical and mechanical connections between the rigid regions 610. Conventional processes, such as punching, drilling, etching, and laser cutting, may be used to implement this technique. This technique may also provide advantages such as are low process complexity due to the traditional fabricating methods listed above, and relatively high alignment accuracy. Additionally, this technique may remove the strain and stress concentration regions around the vertexes, where most damages typically occur, thus improving lifetime of the SED.

FIGS. 7A-7F illustrate a process 700 corresponding to a fifth technique. The fifth technique is to replace at least one portion of the substrate with a different material. The replacing material may have a different rigidity comparing to the original substrate. The original substrate can be either a flexible and bendable substrate, such as a flexible circuit board, or a rigid substrate, such as a silicon wafer. This technique may be implemented in both steps 530 and 550 of method 500.

Figure 7A:
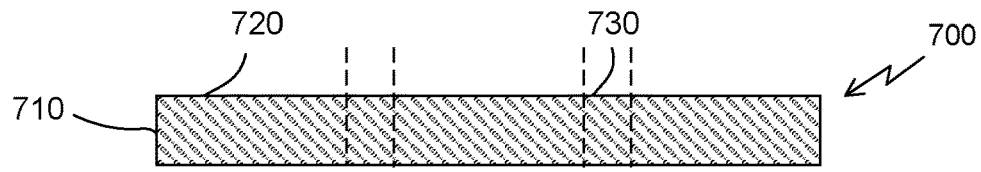
FIGS. 7A-7F illustrate a process of replacing interconnect regions of a substrate with a different material, in accordance with another embodiment.

The process 700 may replace interconnect region 730 of the substrate 700 with a more flexible material in accordance with an embodiment. As depicted in FIG. 7A, the substrate 710 initially may be a homogeneous material. The substrate 710 may be defined with a plurality of rigid regions 720 and interconnects regions 730 in accordance with a folding pattern.

Figure 7B:
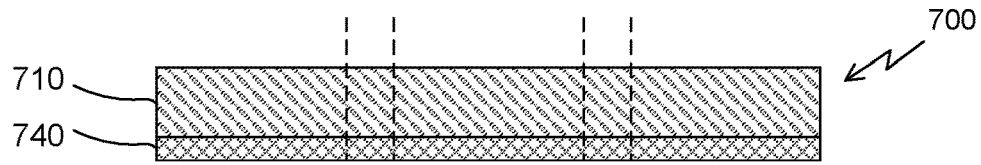

As depicted in FIG. 7B, the substrate 710 may be fixed on a rigid holder 740. A layer of soluble glue, such as photoresist, can be coated between the holder 740 and the substrate 710.

Figure 7C:
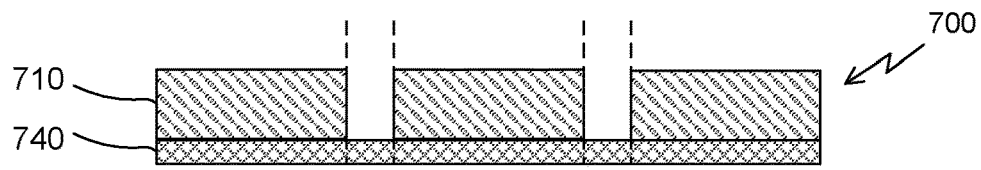

As depicted in FIG. 7C, the interconnect region 730 of the substrate 710 may be removed. The remaining part of the substrate 710 may be the rigid regions 720. The removing process may be performed by chemical processes like chemical etching, or mechanical processes like punching, drilling, and laser ablation.

Figure 7D:
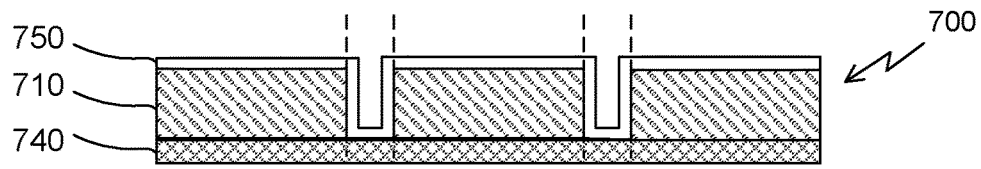

As depicted in FIG. 7D, a layer 750 of relatively flexible material may be deposited on the top of the substrate 710. The flexible material may form a continuous film along the surfaces of the removed interconnect regions 730, such that flexible interconnects may be formed in such interconnect regions 730 to connect the rigid regions 720. In some embodiments, a vapor deposition material, such as Parylene, may be used to cover the interconnect regions 730.

Figure 7E:
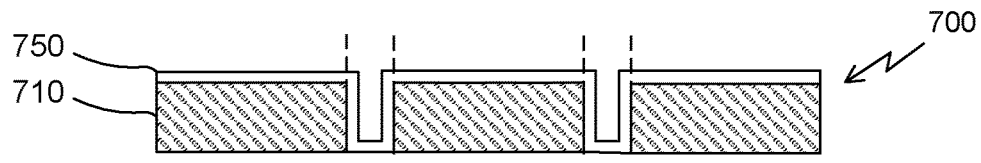

As depicted in FIG. 7E, the substrate 710 may be peeled from the holder 740. The peeling process may be promoted with the aid of the soluble glue applied previously. The substrate 710 may be peeled off by dissolving such glue with a solvent.

Figure 7F:
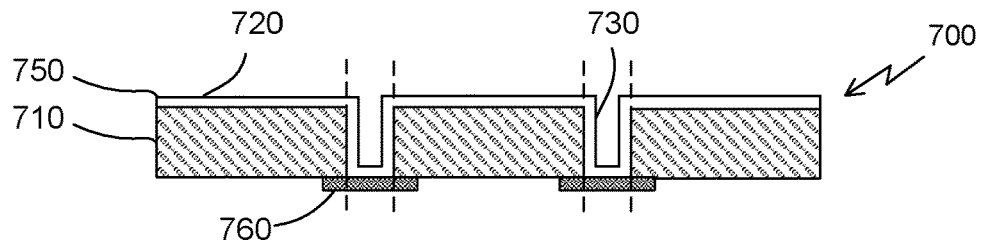

As depicted in FIG. 7F, connecting lines 760 may be fabricated across interconnect regions 730 to build electrical connection between the rigid regions 720. The connecting wires 760 may be made of conductive ink, paste, epoxy, or glue by conventional processes, such as screen printing and dispensing.

The fifth technique may provide high alignment accuracy due to the self-alignment effect and the implementation of machine-patterned processes. Further, with the benefit of the material properties of the replacing material, micro-cracks may not occur in the produced SEDs based on this technique, which may result in a longer lifetime. Still further, this technique may be applied to both flexible and rigid substrates, allowing wider applications.

Various types of stretchable products, such as the origami-based SEDs 100, 300 may be manufacture by implementing the process 400, the method 500 and the aforementioned five techniques of modifying rigidity of the substrate.

Figure 8:
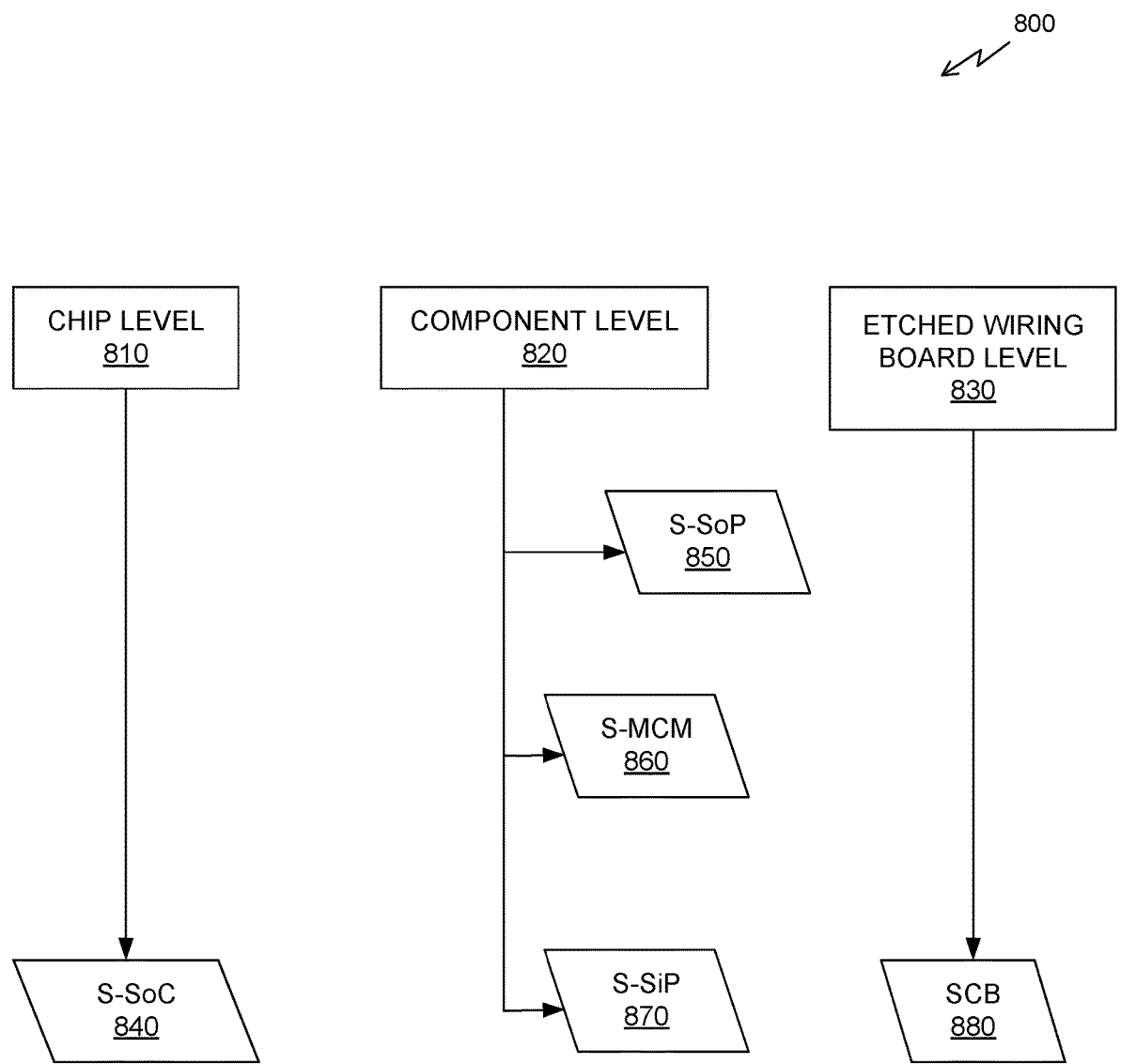
FIG. 8 is a diagram to identify a level and a type of a given SED, in accordance with an embodiment.

FIG. 8 is a diagram 800 to identify a level and a type of a given SED. It will be appreciated that the SED are not limited to the levels and types listed in the diagram of FIG. 8.

The types of SEDs may be categorized into at least three different levels: (1) chip level 810, (2) component level 820, and (3) etched wiring board level 830. A SED may be a stretchable circuit board (SCB) 880 in the category of etched wiring board level 830, when there are no chips or hybrid circuits on the substrate. When a number of mounted packaged electronic components or chips in the SED is below a threshold level, the SED may be a stretchable system on a chip (S-SoC) 840 in the category of chip level 810. Otherwise, the SED may be in the category of component level 820. With hybrid circuits, the SED of the component level 830 may be a stretchable system on a package (S-SoP) 850. Without any hybrid circuit or stacked packaged electronic component, the SED of the component level 830 may be a stretchable multichip module (S-MCM) 860. With stacked packaged electronic components but without any hybrid circuit, the SED of the component level 830 may be a stretchable system in a package (S-SiP) 870.

Figure 9:
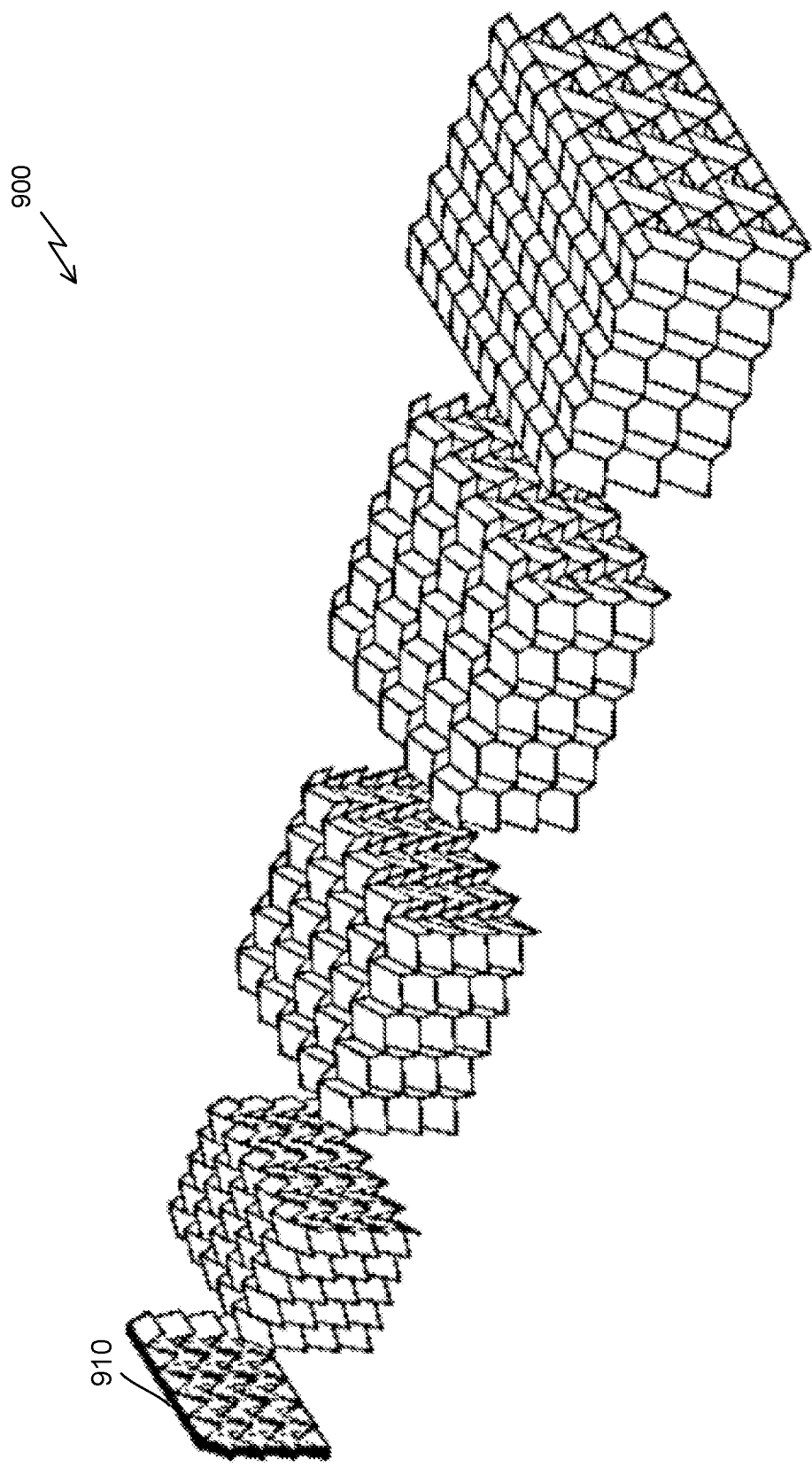
FIG. 9 illustrates a stretchable assembly under different folding configurations, in accordance with an embodiment.

In a further embodiment, several SEDs can be stacked together to form a stretchable assembly, called a stretchable board on board (BoB), or board stack. FIG. 9 illustrates a stretchable assembly 900 under different folding configurations in accordance with an embodiment. The stretchable assembly may be made of a plurality of SEDs stacked together. The stretchable assembly may be converted to an almost planar structure 910 when fully folded. Under different folding configurations, the stretchable assembly may occupy a different amount of three-dimensional space.

It should be understood that the arrangement of components illustrated in the attached Figures are for illustrative purposes and that other arrangements are possible. For example, one or more of the elements described herein may be realized, in whole or in part, as an electronic hardware component. Other elements may be implemented in software, hardware, or a combination of software and hardware. Moreover, some or all of these other elements may be combined, some may be omitted altogether, and additional components may be added while still achieving the functionality described herein. Thus, the subject matter described herein may be embodied in many different variations, and all such variations are contemplated to be within the scope of the claims.

To facilitate an understanding of the subject matter described herein, many aspects are described in terms of sequences of actions. It will be recognized by those skilled in the art that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar references in the context of describing the subject matter (particularly in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. Furthermore, the foregoing description is for the purpose of illustration only, and not for the purpose of limitation, as the scope of protection sought is defined by the claims as set forth hereinafter together with any equivalents thereof. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the embodiments as claimed.

What is claimed is:

1. An electronic device, comprising:
a flexible substrate; and
a plurality of functional components integrated on the flexible substrate;
wherein the flexible substrate is folded into a three-dimensional structure in accordance with an origami or a kirigami pattern,
wherein the flexible substrate comprises a plurality of rigid regions and a plurality of flexible interconnects, and the plurality of flexible interconnects connect the plurality of rigid regions,
wherein at least one portion of the flexible substrate is removed, and the at least one portion removed from the flexible substrate is removed adjacent to a vertex of a rigid region of the origami or kirigami pattern to cause separation of multiple flexible interconnects among the plurality of flexible interconnects at the vertex of the rigid region of the origami or kirigami pattern, and
wherein the functional components are electrically connected and the functional components are mounted on the rigid regions.

2. The electronic device according to claim 1, wherein the flexible substrate is embedded with connecting lines or hybrid microcircuits.

3. The electronic device according to claim 1, wherein the flexible substrate comprises Parylene.

4. The electronic device according to claim 1, wherein the flexible substrate is encapsulated within or covered by a protective layer.

5. The electronic device according to claim 1, wherein the electronic device is stacked on another substrate, wherein the other substrate is folded into an identical three-dimensional structure of the electronic device.

6. The electronic device according to claim 1, wherein the plurality of flexible interconnects are designed with fewer layers, fewer traces, or thinner layers than the rigid regions of the substrate.

7. A method for manufacturing a stretchable electronic device, the method comprising:
- patterning a two-dimensional substrate in accordance with a folding pattern, the folding pattern comprising a plurality of rigid regions and a plurality of flexible interconnects;
- integrating a plurality of functional components on the two-dimensional substrate;
- modifying a rigidity of the two-dimensional substrate in accordance with the folding pattern; and
- folding the two-dimensional substrate to a three-dimensional structure,
- wherein modifying the rigidity of the two-dimensional substrate in accordance with the folding pattern comprises removing at least one first portion of the flexible substrate, and the at least one first portion removed from the flexible substrate is removed adjacent to a vertex of a rigid region of the folding pattern to cause separation of multiple flexible interconnects among the plurality of flexible interconnects at the vertex of the rigid region of the folding pattern.

8. The method according to claim 7, wherein the modifying the rigidity of the two-dimensional substrate in accordance with the folding pattern further comprises:
- applying a pressure to the plurality of flexible interconnects of the folding pattern.

9. The method according to claim 7, wherein the modifying the rigidity of the two-dimensional substrate in accordance with the folding pattern further comprises:
- attaching a plurality of stiffeners to the rigid regions of the folding pattern.

10. The method according to claim 7, the method further comprising:
- removing at least one second portion of the two-dimensional substrate.

11. The method according to claim 10, wherein the at least one second portion of the two-dimensional substrate is removed from the plurality of flexible interconnects, and the method further comprises:
- coating the two-dimensional substrate with a layer of flexible material to form a new interconnect within the layer of flexible material.

12. The method according to claim 7, the method further comprising:
- encapsulating the folded substrate with an encapsulation material.

13. A method for manufacturing a stretchable electronic device, the method comprising:
- patterning a two-dimensional substrate in accordance with a folding pattern, the folding pattern comprising a tessellation of parallelograms;
- modifying rigidity of the substrate in accordance with the folding pattern;
- integrating a plurality of functional components on the two-dimensional substrate; and
- folding the two-dimensional substrate to a three-dimensional structure,
- wherein modifying the rigidity of the substrate in accordance with the folding pattern comprises removing at least one first portion of the two-dimensional substrate, and the at least one first portion removed from the two-dimensional substrate is removed adjacent to a vertex of a parallelogram of the folding pattern to cause separation of multiple flexible interconnects at the vertex of the parallelogram of the folding pattern.

14. The method according to claim 13, wherein the modifying the rigidity of the substrate is performed after the integrating the plurality of functional components on the two-dimensional substrate.

15. The method according to claim 13, wherein the modifying the rigidity of the substrate in accordance with the folding pattern further comprises:
- attaching a plurality of stiffeners to the parallelograms of the folding pattern.

16. The method according to claim 13, the method further comprising:
- removing at least one second portion of the two-dimensional substrate.

17. The method according to claim 16, wherein the removed second portion of the two-dimensional substrate is at a creased region of the substrate associated with an edge of a parallelogram among the parallelograms in the folding pattern, and the method further comprises:
- coating the two-dimensional substrate with a layer of flexible material to form a new interconnect with the layer of the flexible material.

18. The method according to claim 13, further comprising encapsulating the folded substrate with an encapsulation material.

19. The method according to claim 13, wherein creased regions of the substrate associated with edges of the parallelograms are designed to have fewer layers, fewer traces, or thinner layers than the rigid regions of the substrate.

* * * * *